US012663723B2

(12) United States Patent
Shirakawa

(10) Patent No.: US 12,663,723 B2
(45) Date of Patent: Jun. 23, 2026

(54) WASHOUT PROCESSOR AND WASHING METHOD

(71) Applicant: FUJIFILM Corporation, Tokyo (JP)

(72) Inventor: Masato Shirakawa, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 8 days.

(21) Appl. No.: 18/422,781

(22) Filed: Jan. 25, 2024

(65) Prior Publication Data

US 2024/0210834 A1      Jun. 27, 2024

Related U.S. Application Data

(63) Continuation of application No. PCT/JP2022/028621, filed on Jul. 25, 2022.

(30) Foreign Application Priority Data

Jul. 30, 2021    (JP) ................................. 2021-125534
Nov. 30, 2021    (JP) ................................. 2021-193793

(51) Int. Cl.
*G03F 7/30*          (2006.01)
*B41F 5/24*          (2006.01)
(52) U.S. Cl.
CPC .............. *G03F 7/3057* (2013.01); *B41F 5/24* (2013.01); *G03F 7/305* (2013.01); *G03F 7/3085* (2013.01)
(58) Field of Classification Search
CPC ....................................................... G03F 7/30
See application file for complete search history.

(56) References Cited

U.S. PATENT DOCUMENTS 5,436,105 A  *  7/1995  Shimizu .................. G03F 7/305
                                                        430/326
2021/0349394 A1*  11/2021  Ikeyama ................. G03F 7/322

FOREIGN PATENT DOCUMENTS

JP        62-217249 A      9/1987
JP        S62217249 A  *  9/1987
(Continued)

OTHER PUBLICATIONS

International Search Report issued Aug. 30, 2022 in International Application No. PCT/JP2022/028621.
(Continued)

*Primary Examiner* — Chanceity N Robinson
(74) *Attorney, Agent, or Firm* — Sughrue Mion, PLLC

(57)          ABSTRACT

A washout processor and a washing method suppress brush marks and development unevenness. The processor includes a unit that performs development by simultaneously performing circular movement and linear reciprocation of a developing brush on the flexographic printing plate precursor. The circular movement and the linear reciprocation of the developing brush satisfy at least one of conditions (a) or (b). Condition (a) when a stop time when switching between directions of the linear reciprocation of the developing brush is t seconds and a rotation speed of the circular movement of the developing brush is R times per second, t<R is satisfied. Condition (b) when the number of times of linear reciprocation per unit time in the linear reciprocation of the developing brush is f times per second and the rotation speed of the circular movement of the developing brush is R times per second, f<R is satisfied.

5 Claims, 5 Drawing Sheets

(56)                    References Cited

FOREIGN PATENT DOCUMENTS

JP            5-080536  A        4/1993
JP            08076383  A   *   3/1996
JP         2005208371  A   *   8/2005
JP         2020-079840  A       5/2020
WO         2020/158380  A1      8/2020

OTHER PUBLICATIONS

Written Opinion issued Aug. 30, 2022 in International Application No. PCT/JP2022/028621.
International Preliminary Report on Patentability dated Jan. 18, 2024 with a Translation of the Written Opinion of the International Searching Authority in Application No. PCT/JP2022/028621.
Extended European Search Report dated May 22, 2025 in Application No. 22849429.0.
Japanese Office Action dated Feb. 17, 2026, issued in Japanese application No. 2023-538517.
Communication dated May 19, 2026, issued in Japanese Application No. 2023-538517.

* cited by examiner

FIG. 4

WASHOUT PROCESSOR AND WASHING METHOD

CROSS-REFERENCE TO RELATED APPLICATIONS

This application is a Continuation of PCT International Application No. PCT/JP2022/028621 filed on Jul. 25, 2022, which claims priority under 35 U.S.C. § 119(a) to Japanese Patent Application No. 2021-125534 filed on Jul. 30, 2021 and Japanese Patent Application No. 2021-193793 filed on Nov. 30, 2021. The above applications are hereby expressly incorporated by reference, in their entirety, into the present application.

BACKGROUND OF THE INVENTION

1. Field of the Invention

The present invention relates to a washout processor and a washing method in which an imagewise exposed flexographic printing plate precursor is developed using a washing solution with a developing brush and particularly relates to a washout processor and a washing method in which an operation of the developing brush during development is controlled.

2. Description of the Related Art

Various types of methods are known as developing methods for a printing plate formed of a photosensitive resin plate. For example, in a developing method of performing development using a water-based washing solution of which a main component is water, development is performed by applying the water-based washing solution to an imagewise exposed photosensitive resin plate with a brush or the like and washing out an uncured resin or the like, which is a non-exposed portion. The water-based washing solution is also referred to as a developer.

For example, JP2005-208371A describes a plate-making apparatus for a photosensitive resin plate that has an apparatus main body consisting of an upper portion and a lower portion which are pivotally attached to each other so as to be openable and closable, in which the lower portion is provided with a fixing base for fixing the photosensitive resin plate, the upper portion is provided with a cleaning brush and a drive mechanism for driving the cleaning brush, the drive mechanism consists of a circular movement generating mechanism and a linear reciprocation generating mechanism for causing the circular movement generating mechanism to make linear reciprocation, and the cleaning brush is disposed such that bristle tips face downward.

SUMMARY OF THE INVENTION

The plate-making apparatus for a photosensitive resin plate of JP2005-208371A has the drive mechanism causing the cleaning brush to make circular movement and linear reciprocation. Since a circumferential speed is different between a center and an outer edge of the rotating brush and a development speed is also different therebetween, it is not always possible to perform uniform development. Even in a case where the brush is linearly moved, it is not always possible to perform uniform development depending on a state of linear movement. For this reason, as in JP2005-208371A, even in a case where the cleaning brush is circularly moved and linearly reciprocated, a brush mark is generated, and development unevenness is generated in some cases.

An object of the present invention is to provide a washout processor and a washing method that suppress generation of a brush mark and that suppress generation of development unevenness.

According to an aspect of the present invention, in order to achieve the object described above, there is provided a washout processor that develops an imagewise exposed flexographic printing plate precursor using a washing solution with a developing brush, the washout processor including a development unit that performs development using the washing solution by simultaneously performing circular movement and linear reciprocation of the developing brush on the imagewise exposed flexographic printing plate precursor, in which the circular movement and the linear reciprocation of the developing brush by the development unit satisfy at least one of the following condition (a) or (b), condition (a) in a case where a stop time in a case of switching between directions of linear reciprocation of the developing brush is t seconds and the rotation speed of circular movement of the developing brush is R times per second, $t<R$, condition (b) in a case where the number of times of linear reciprocation per unit time in linear reciprocation of the developing brush is f times per second and the rotation speed of circular movement of the developing brush is R times per second, $f<R$.

It is preferable that the circular movement and the linear reciprocation of the developing brush by the development unit satisfy the following condition (c), condition (c) in a case where the moving distance in linear reciprocation of the developing brush is d millimeters and the radius of circular movement of the developing brush is r millimeters, $d \geq r$.

It is preferable that the circular movement and the linear reciprocation of the developing brush by the development unit satisfy the conditions (a), (b), and (c).

It is preferable that development is performed while the washing solution is supplied from above the developing brush.

It is preferable that the washing solution has water as a main component.

It is preferable that the developing brush has a substrate and a bristle. It is preferable that a material for the substrate is a thermoplastic resin, and the thermoplastic resin has a tensile modulus of $25{,}000 \text{ kg/cm}^2$ or more and an elongation rate of 10% or more measured according to ASTM International D638.

It is preferable that the thermoplastic resin is vinyl chloride or a polyacetal resin.

It is preferable that a material for the bristle of the developing brush is nylon 6,12.

According to another aspect of the present invention, there is provided a washing method of developing an imagewise exposed flexographic printing plate precursor using a washing solution with a developing brush, the washing method including a step of performing development by simultaneously performing circular movement and linear reciprocation of the developing brush on the imagewise exposed flexographic printing plate precursor, in which the circular movement and the linear reciprocation of the developing brush satisfy at least one of the following condition (a) or (b), condition (a) in a case where a stop time in a case of switching between directions of linear reciprocation of the developing brush is t seconds and the rotation speed of circular movement of the developing brush is R times per second, t<R, condition (b) in a case where the number of times of linear reciprocation per unit time in linear reciprocation of the developing brush is f times per second and the rotation speed of circular movement of the developing brush is R times per second, f<R.

It is preferable that the circular movement and the linear reciprocation of the developing brush satisfy the following condition (c), condition (c) in a case where the moving distance in linear reciprocation of the developing brush is d millimeters and the radius of circular movement of the developing brush is r millimeters, d≥r.

It is preferable that the circular movement and the linear reciprocation of the developing brush satisfy the conditions (a), (b), and (c).

It is preferable that development is performed while the washing solution is supplied from above the developing brush.

It is preferable that the washing solution has water as a main component.

It is preferable that the developing brush has a bristle and a substrate. It is preferable that a material for the substrate is a thermoplastic resin, and the thermoplastic resin has a tensile modulus of 25,000 kg/cm² or more and an elongation rate of 10% or more measured according to ASTM International D638.

It is preferable that the thermoplastic resin is vinyl chloride or a polyacetal resin.

It is preferable that a material for the bristle of the developing brush is nylon 6,12.

With the present invention, generation of a brush mark can be suppressed, and generation of development unevenness can be suppressed.

BRIEF DESCRIPTION OF THE DRAWINGS

FIG. 4 is a schematic view showing a second example of the washout processor according to the embodiment of the present invention.

DESCRIPTION OF THE PREFERRED EMBODIMENTS

Hereinafter, a washout processor and a washing method according to an embodiment of the present invention will be described in detail based on the suitable embodiment shown in the accompanying drawings.

The drawings to be described below are exemplary for describing the present invention, and the present invention is not limited to the drawings shown below.

In the following, "to" indicating a numerical range includes numerical values described on both sides. For example, in a case where ε is a numerical value α to a numerical value β, the range ε is a range including the numerical value α and the numerical value β, which is expressed by a mathematical symbol α≤ε≤β.

Angles such as "perpendicular" and "parallel" include a range of errors generally acceptable in the corresponding technical field unless particularly stated otherwise.

First Example of Washout Processor

Figure 1:
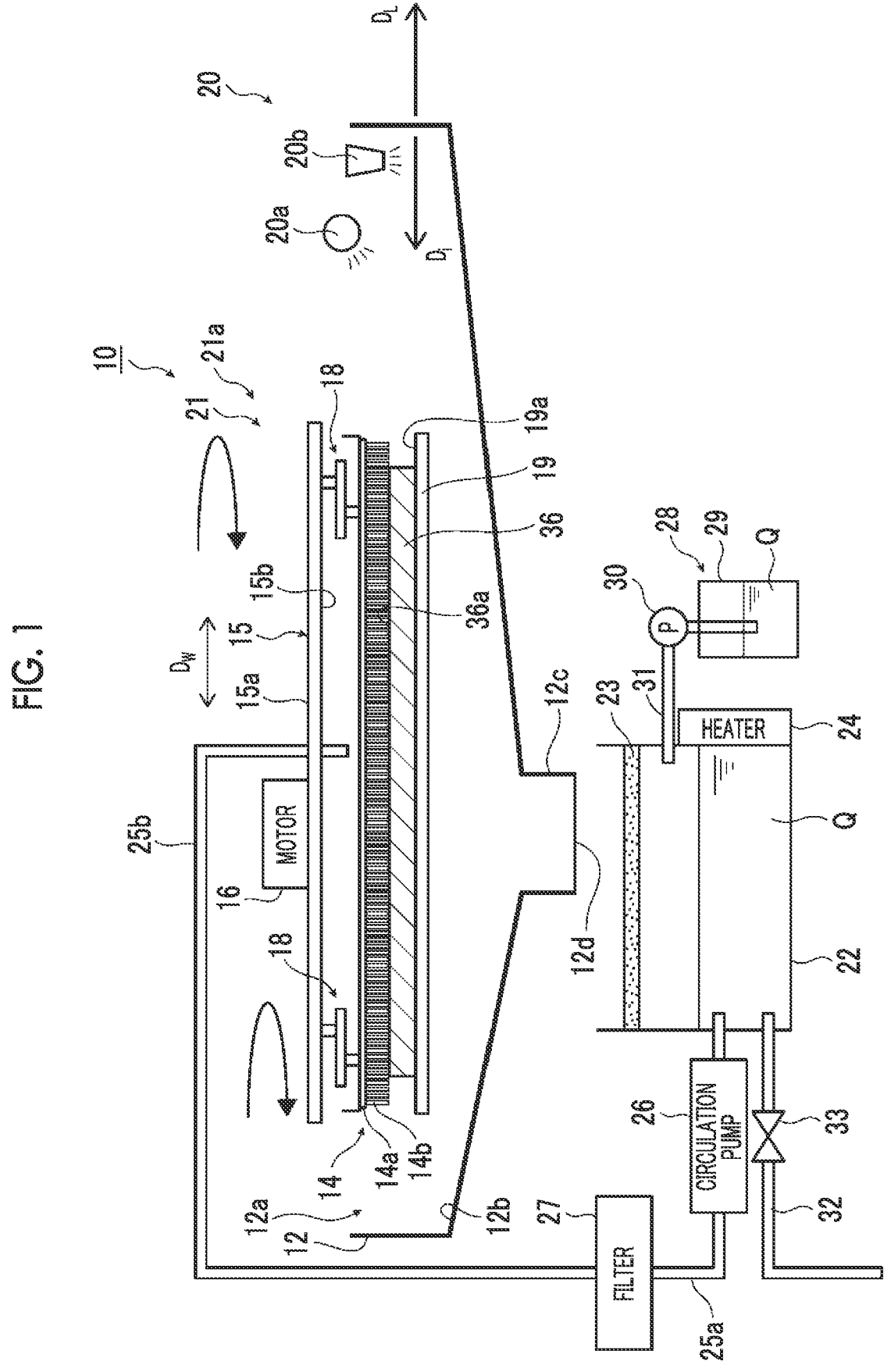
FIG. 1 is a schematic view showing a first example of a washout processor according to an embodiment of the present invention.

FIG. 1 is a schematic view showing a first example of the washout processor according to the embodiment of the present invention.

A washout processor 10 shown in FIG. 1 has a developing tank 12 and a developing brush 14. Each configuration unit of the washout processor 10 is controlled by a control unit (not shown).

An imagewise exposed flexographic printing plate precursor 36 is developed in the developing tank 12. The developing brush 14 is disposed on an opening 12a side in the developing tank 12. On a bottom portion 12b side of the developing tank 12, a support plate 19 is disposed to face the developing brush 14.

The imagewise exposed flexographic printing plate precursor 36 is disposed on a front surface 19a of the support plate 19. The flexographic printing plate precursor 36 is, for example, quadrangular in plan view.

The developing brush 14 has a substrate 14a and bristles 14b. A support member 15 is provided on an opposite side of the bristles 14b of the substrate 14a. The substrate 14a is, for example, quadrangular in plan view.

For example, four cranks 18 are provided on a surface 15b of the support member 15 on a substrate 14a side. Each crank 18 is connected to a corner portion of the quadrangular substrate 14a of the developing brush 14.

For example, a motor 16 is provided at a center position of a surface 15a of the support member 15 on the opposite side of the substrate 14a in plan view. Each of the four cranks 18 is connected to the motor 16. A method of connecting the motor 16 and the four cranks 18 to each other is not particularly limited, and connection is made through a known connecting method. The four cranks 18 are simultaneously rotated by the motor 16. Accordingly, the developing brush 14 moves circularly. Circular movement of the developing brush 14 means that a bristle bundle 14c (see FIG. 2) of the developing brush 14 moves on a circular trajectory 14d shown in FIG. 3 as will be described later. In addition, movement of the bristle bundle 14c of the developing brush 14 (see FIG. 2) on the circular trajectory 14d shown in FIG. 3 as will be described later, which is caused by movement of the flexographic printing plate precursor 36 relative to the developing brush 14, instead of movement of the developing brush 14, in a state where the developing brush 14 is fixed is also included in the circular movement of the developing brush 14.

By changing the rotation speed of the motor 16, the rotation speed of circular movement of the developing brush 14 can be adjusted. In addition, the radius of the circular movement of the developing brush 14 is determined by, for example, the size of the crank 18. The radius of the circular movement of the developing brush 14 is adjusted by the size of the crank 18.

For example, a driving unit 21 is composed of the support member 15, the motor 16, and the cranks 18 shown in FIG. 1. A development unit 21a has the driving unit 21 and the developing brush 14. The development unit 21*a* simultaneously causes the developing brush 14 to circularly move and linearly reciprocate on the imagewise exposed flexographic printing plate precursor 36 and rubs the imagewise exposed flexographic printing plate precursor 36 with the developing brush 14, performing development using a washing solution Q. Herein, simultaneously causing the developing brush 14 to circularly move and linearly reciprocate means causing a state where the developing brush 14 circularly moves and a state where the developing brush 14 linearly reciprocates.

In addition, a drive mechanism (not shown) for moving the support member 15 in a direction Dw parallel to the front surface 19*a* of the support plate 19 is included. The direction Dw is a linear reciprocating direction of the developing brush 14. The developing brush 14 is moved in the direction Dw by the drive mechanism. That is, the developing brush 14 is linearly reciprocated. The linear reciprocation of the developing brush 14 is reciprocation of the developing brush 14 with respect to a specific linear direction, for example, the direction Dw. Reciprocation of the flexographic printing plate precursor 36, instead of reciprocation of the developing brush 14, with respect to the specific linear direction, for example, the direction Dw relative to the developing brush 14 in a state where the developing brush 14 is fixed is also included in the linear reciprocation of the developing brush 14.

The drive mechanism further moves the developing brush 14 by a distance set in one direction in the direction Dw in a state of rotationally moving the developing brush, then reverses and moves the developing brush by a distance set in the other direction, which is an opposite direction of the one direction, and linearly reciprocates the developing brush 14. The drive mechanism reciprocates the developing brush 14 a set number of times of reciprocation. The set distance described above is also referred to as a stroke. In addition, the drive mechanism can also adjust the speed of linear reciprocation of the developing brush 14, that is, a moving speed in the direction Dw.

The moving speed in the direction Dw described above, the set distance described above, a total reciprocating distance, the number of times of reciprocation in linear reciprocation are not particularly limited and are determined as appropriate depending on development of the flexographic printing plate precursor 36.

The drive mechanism has, for example, a guide roller (not shown), a guide frame (not shown), and a motor (not shown). The drive mechanism may be configured to have a linear guide and the motor. The developing brush 14 is rotated by the driving unit 21 and the drive mechanism, the support member 15 can be moved in the direction Dw, and the developing brush 14 can be circularly moved and linearly reciprocated simultaneously. A direction of linear reciprocation is not particularly limited to the direction Dw.

In addition, the flexographic printing plate precursor 36 is carried into or carried out with respect to the developing tank 12 from a side of the developing tank 12. A rinsing unit 20 is provided at a carrying-out destination for the flexographic printing plate precursor 36. That is, the rinsing unit 20 is provided on a downstream side in a traveling direction $D_L$ of the flexographic printing plate precursor 36.

The rinsing unit 20 supplies a rinsing liquid to a front surface 36*a* of the developed flexographic printing plate precursor 36 and removes residues remaining on the front surface 36*a* of the developed flexographic printing plate precursor 36 such as latex components and rubber components using the rinsing liquid.

The rinsing liquid is a liquid of which substantially only component is water, and for example, fresh water, tap water, industrial water, ground water, and the like can be used. The substantially only water means that water is 99.50% by mass or more as a component of the rinsing liquid, and water preferably exceeds 99.99% by mass and is most preferably only water.

The rinsing unit 20 has a rinsing liquid supply unit 20*a* and a liquid drain nozzle 20*b*.

The liquid drain nozzle 20*b* is provided on the downstream side of the rinsing liquid supply unit 20*a* in the traveling direction $D_L$ of the flexographic printing plate precursor 36, that is, an upstream side in a carry-in direction Di.

The rinsing liquid supply unit 20*a* supplies, for example, a rinsing liquid from a nozzle to the front surface 36*a* of the flexographic printing plate precursor 36.

For example, a sensor (not shown) that detects the flexographic printing plate precursor 36 is provided, a timing when the flexographic printing plate precursor 36 passes through is detected, and the rinsing liquid is supplied from the rinsing liquid supply unit 20*a* of the rinsing unit 20 to at least the front surface 36*a* of the developed flexographic printing plate precursor 36 from which a non-exposed portion is removed via the nozzle.

The liquid drain nozzle 20*b* removes the rinsing liquid supplied to the flexographic printing plate precursor 36 by the rinsing liquid supply unit 20*a* by jetting a gas or removes the rinsing liquid by sucking a gas. Insofar as the jetting of the gas or the sucking of the gas can be performed, the configuration of the liquid drain nozzle 20*b* is not particularly limited, and various types of pumps can be used.

As the rinsing unit 20 is provided with the rinsing liquid supply unit 20*a* and the liquid drain nozzle 20*b*, the liquid drain nozzle 20*b* entrains a rinsing liquid from the rinsing liquid supply unit 20*a* by removing the rinsing liquid supplied to the flexographic printing plate precursor 36 through jetting of a gas or by removing the rinsing liquid through sucking of a gas, the rinsing liquid spreads on the front surface 36*a* of the flexographic printing plate precursor 36 even in a case where a supply amount of the rinsing liquid from the rinsing liquid supply unit 20*a* is small, and thereby the non-exposed portion described above can be removed. Accordingly, the amount of the rinsing liquid necessary for removing residues such as latex components and rubber components remaining on the front surface 36*a* of the developed flexographic printing plate precursor 36 can be decreased.

It is preferable to drive the rinsing liquid supply unit 20*a* and the liquid drain nozzle 20*b* simultaneously. By driving the rinsing liquid supply unit 20*a* and the liquid drain nozzle 20*b* simultaneously, the effect of entrainment of the rinsing liquid is further obtained.

The rinsing unit 20 may have a rotating brush (not shown) for removing development residues remaining on a plate surface after development.

It is preferable that bristles of the rotating brush use, instead of unbent bristles, wavy bristles which are called curly bristles or curled bristles, rather than straight bristles. In a case where bristles obtained by adding a fine abrasive material such as alumina and silicon carbide to a nylon thread, as a material for the bristles of the rotating brush, are used, abrasion of the brush can also be reduced, and a brush life can be extended, which is preferable.

The developing tank 12 is provided with a discharge unit 12*c* at a bottom portion 12*b*. An opening portion 12*d* is provided in the discharge unit 12*c*. A tank 22 is provided below the discharge unit 12c. The bottom portion 12b is inclined toward the discharge unit 12c. The washing solution Q that is used in development and that has fallen to the bottom portion 12b is stored in the tank 22 via the opening portion 12d of the discharge unit 12c.

The tank 22 stores the washing solution Q. The tank 22 is provided with, for example, a filter 23 on an opening portion 12d side.

The washing solution Q that is disposed at an opening portion of the tank 22 and that is used in development passes through the filter 23 via the opening portion 12d of the developing tank 12. In addition, a rinsing liquid passes through the filter 23 via the opening portion 12d of the developing tank 12.

The filter 23 removes a non-exposed portion of the flexographic printing plate precursor 36 which is generated by development from the washing solution Q. In addition, residues such as latex components and rubber components remaining on the front surface 36a of the developed flexographic printing plate precursor 36 from which the non-exposed portion is removed are also removed by the filter 23 with the rinsing liquid. The filter 23 is not particularly limited, and for example, a polyolefin-based resin nonwoven fabric is used.

In addition to the washing solution Q, the washing solution Q used in development, the rinsing liquid, or the like is also stored in the tank 22. The washing solution Q used in development is referred to as a fatigued developer.

The tank 22 is provided with a heater 24 on, for example, an outside.

The heater 24 adjusts the temperature of the washing solution Q in the tank 22 to a determined temperature, for example, a range of 40° C. to 50° C. The configuration of the heater 24 is not particularly limited, and a known configuration is usable as appropriate.

A pipe 25a is connected to the tank 22, and a circulation pump 26 and a filter 27 are provided at the pipe 25a. A pipe 25b is provided at the filter 27, and an opening of the pipe 25b is disposed above the developing brush 14. Accordingly, the washing solution Q in the tank 22 can be supplied to the developing brush 14.

The filter 27 is not particularly limited insofar as solid contents contained in the washing solution after development can be separated out and is determined as appropriate according to the size of solid contents to be separated out. For example, a ceramic filter is used. It is preferable that the filter 27 can separate out, for example, a solid content having a particle diameter of 1 μm or less.

The washout processor 10 has a replenishing unit 28 for the washing solution Q. The replenishing unit 28 has a replenishment tank 29 and a replenishment pump 30. The washing solution Q is stored in the replenishment tank 29.

A pipe 31 provided at the replenishment pump 30 is disposed in the tank 22. Accordingly, the washing solution Q in the replenishment tank 29 can be supplied into the tank 22 by the replenishment pump 30.

In addition, a discharge pipe 32 for discharging the washing solution Q therein to the outside is provided at the tank 22. A valve 33 is provided at the discharge pipe 32. By opening the valve 33, the washing solution Q in the tank 22 is discharged to the outside of the tank 22.

A circulation path for the washing solution Q is composed of the developing tank 12, the tank 22, the circulation pump 26, and the filter 27.

<Developing Brush>

Figure 2:
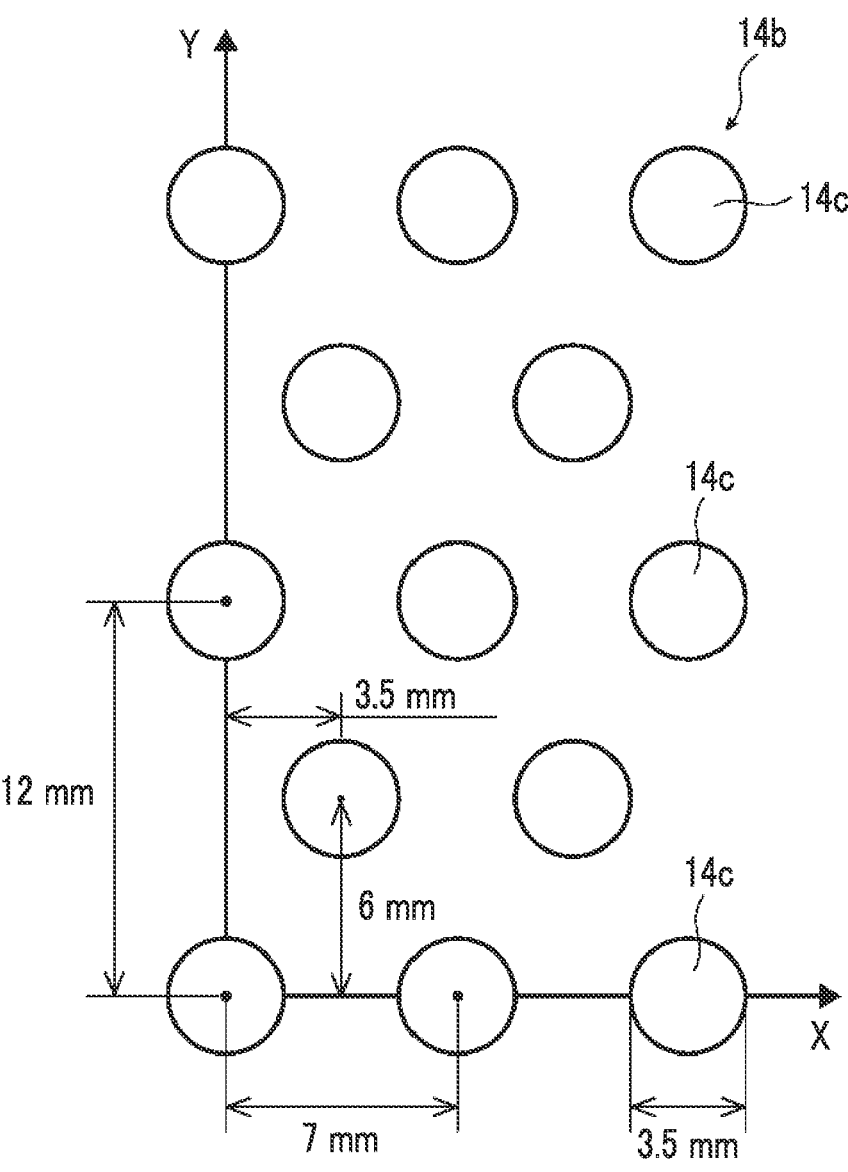
FIG. 2 is a schematic view showing an example of disposition of a bristle bundle of a developing brush used in the first example of the washout processor according to the embodiment of the present invention.

FIG. 2 is a schematic view showing an example of disposition of a bristle bundle of the developing brush used

Figure 3:
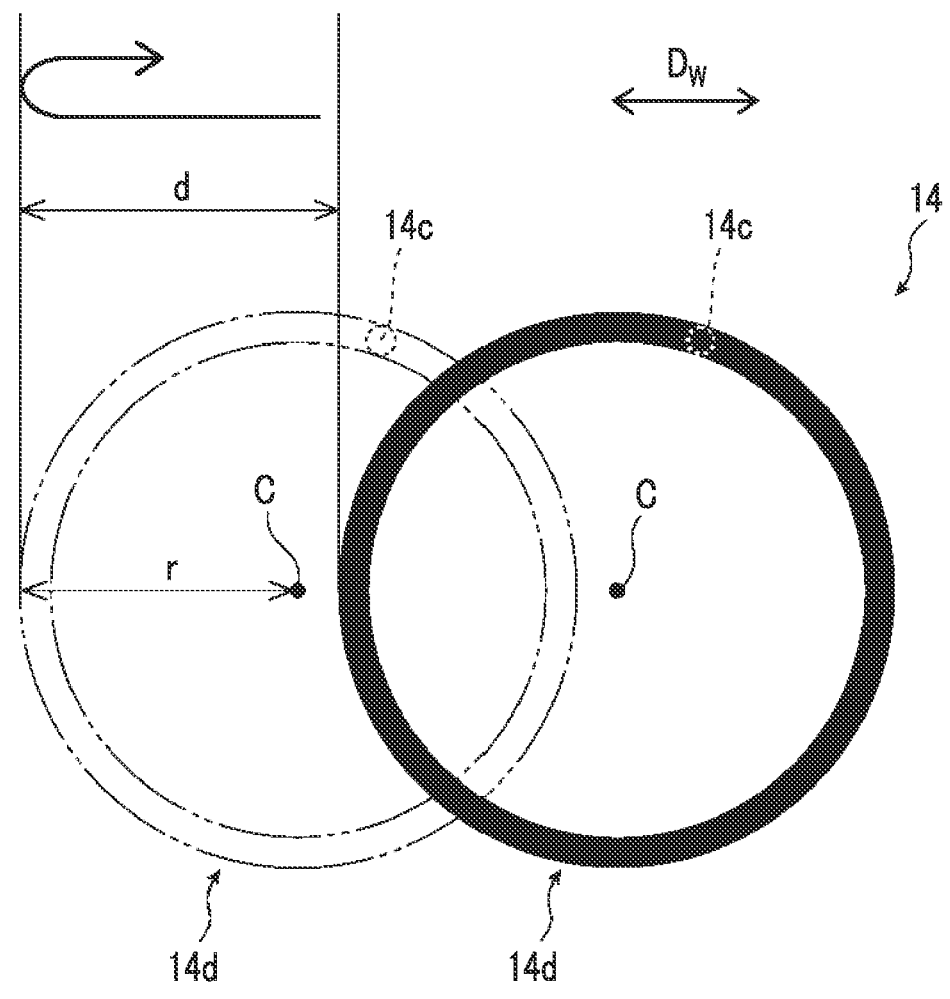
FIG. 3 is a schematic view showing an example of a trajectory of the bristle bundle of the developing brush used in the first example of the washout processor according to the embodiment of the present invention.

8 in a first example of the washout processor according to the embodiment of the present invention, and FIG. 3 is a schematic view showing an example of a trajectory of the bristle bundle of the developing brush used in the first example of the washout processor according to the embodiment of the present invention.

Development is performed on the flexographic printing plate precursor 36 using the developing brush 14. The developing brush 14 is obtained, for example, by bundling the bristles 14b perpendicular to the quadrangular substrate 14a in plan view. In the configuration, the bristles 14b of the developing brush 14 are substantially perpendicular to the front surface 36a of the flexographic printing plate precursor 36.

The shape of the substrate 14a is the shape of the developing brush 14. The shape of the substrate 14a is not limited to a quadrangle in plan view.

It is preferable that the substrate 14a is formed of a thermoplastic resin from a perspective of mechanical stability of the substrate 14a and ease of processing on the developing brush. It is preferable that the thermoplastic resin has a tensile modulus of 25,000 $kg/cm^2$ or more and an elongation rate of 10% or more which are measured according to ASTM International D638.

In a case where the thermoplastic resin has a tensile modulus of 25,000 $kg/cm^2$ or more and an elongation rate of 10% or more which are measured according to ASTM International D638, the thermoplastic resin is excellent in mechanical stability and is unlikely to be twisted during development, and an unexpected trajectory for a brush bristle bundle is unlikely to be generated.

The elongation rate of the thermoplastic resin is a value measured under conditions described in ASTM International D638 described above.

Although the thermoplastic resin is not particularly limited, it is preferable that among thermoplastic resins, a thermoplastic resin is vinyl chloride or a polyacetal resin since vinyl chloride or a polyacetal resin has a tensile modulus of 25,000 $kg/cm^2$ or more and an elongation rate of 10% or more which are measured according to ASTM International D638 and is excellent in terms of costs.

A material for the bristles of the developing brush 14 is not particularly limited, and for example, a known material used for development of the flexographic printing plate precursor 36, such as nylon 6,6, nylon 6,12, nylon 610, nylon 612, polybutylene terephthalate (PBT), and polyethylene terephthalate (PET), can be used as appropriate. As the material for the bristles of the developing brush 14, a material having high strength like nylon 6,12 is preferable since a development time of the flexographic printing plate precursor 36 can be shortened. The development time is a time until a floor thickness of the flexographic printing plate precursor 36 becomes a set thickness.

As shown in FIG. 2, the developing brush 14 has the bristle bundle 14c composed of the bristles 14b. The bristle bundles 14c each have a circular shape in plan view and are provided, for example, at intervals along an X-direction and a Y-direction. The bristle bundles 14c adjacent to each other in the Y-direction are disposed such that positions in the X-direction do not overlap each other. For example, the diameter of the bristle bundle 14c is 3.5 mm, a distance between centers of the bristle bundles 14c adjacent to each other in the Y-direction is 12 mm, and a distance between centers in the X-direction is 7 mm. Disposition of the bristle bundles 14c is not particularly limited to the disposition shown in FIG. 2.

During development, the driving unit 21 of the development unit 21a simultaneously performs circular movement and linear reciprocation of the developing brush 14.

The circular movement and linear reciprocation of the developing brush 14 by the driving unit 21 of the development unit 21a satisfies at least one of the following condition (a) or (b).

Condition (a) In a case where a stop time in a case of switching between directions of linear reciprocation of the developing brush is t seconds and the rotation speed of circular movement of the developing brush is R times per second, t<R Condition (b) In a case where the number of times of linear reciprocation per unit time in linear reciprocation of the developing brush is f times per second and the rotation speed of circular movement of the developing brush is R times per second, f<R As at least one of the conditions (a) or (b) is satisfied, generation of a brush mark on the flexographic printing plate precursor is suppressed, and thereby generation of development unevenness can be suppressed.

As t<R is satisfied under the condition (a), during the stop in a case of switching between directions from a state where the developing brush 14 linearly reciprocates, rubbing of the same place by the bristle bundle 14c is suppressed, generation of a brush mark at a position where the developing brush 14 is stopped can be suppressed, and generation of development unevenness can be suppressed. In a case of t≥R, the same place of the flexographic printing plate precursor 36 is rubbed by the bristle bundle 14c of the developing brush 14, and for example, a dot-like brush mark is generated on the flexographic printing plate precursor 36 at the position where the developing brush 14 is stopped.

The dot-like brush mark is a concentration unevenness failure that is generated due to development unevenness in a case where an image centered on nets is printed and refers to a failure in which concentration unevenness looks like dots.

As f<R is satisfied under the condition (b), since linear reciprocation is possible in a state where development by the developing brush 14 can be reliably performed and can be ensured, generation of streak unevenness in the direction of linear reciprocation can be suppressed, and generation of development unevenness can be suppressed. In a case of f≥R, movement of the developing brush 14 in the direction Dw becomes faster, and for example, a streak-like brush mark is generated on the flexographic printing plate precursor 36 due to reciprocation of the developing brush 14.

The streak-like brush mark is a concentration unevenness failure that is generated due to development unevenness in a case where an image centered on nets is printed and refers to a failure in which concentration unevenness looks like streaks.

The rotation speed of the circular movement of the developing brush 14 is preferably 10 to 120 times per second (rps), more preferably 30 to 80 times per second, and even more preferably 40 to 70 times per second.

The number of times of linear reciprocation per unit time in linear reciprocation of the developing brush 14 is f times per second, a moving distance is d (mm), and a reciprocation speed is $S_d$ (mm/sec). In this case, the number of times of linear reciprocation per unit time f in linear reciprocation of the developing brush 14 is obtained by measuring a time for which the developing brush 14 makes one time of reciprocation and calculating a reciprocal of the time for which one time of reciprocation is made. The number of times of linear reciprocation per unit time f in linear reciprocation of the developing brush 14 is $f=1/(2d/S_d)$. The moving distance d (mm) is a one-way distance of one time of reciprocation of the developing brush 14, and a distance of one time of reciprocation of the developing brush 14 is twice the moving distance d (mm).

The number of times of linear reciprocation per unit time in linear reciprocation of the developing brush 14 is preferably less than two times per second, more preferably less than 1.3 times per second, and even more preferably less than 1 time per second.

The stop time t (second) in a case of switching between directions of linear reciprocation is a time until the direction is changed and movement is started after moving by the set distance. In a case where the stop time t (second) in a case of switching between directions of linear reciprocation is longer than the rotation speed of circular movement of the developing brush 14, a brush mark is generated by rubbing the same place with the developing brush 14.

The stop time t (second) in a case of switching between directions of linear reciprocation is preferably less than 2 seconds, more preferably less than 1 second, and even more preferably less than 0.5 seconds.

Further, it is preferable that circular movement and linear reciprocation of the developing brush 14 by the driving unit 21 of the development unit 21a preferably satisfy the following condition (c) and most preferably satisfy all the conditions (a) to (c).

Condition (c) In a case where the moving distance in linear reciprocation of the developing brush is d millimeters and the radius of circular movement of the developing brush is r millimeters, d≥r Herein, FIG. 3 shows the trajectory 14d of circular movement of the bristle bundle 14c of the developing brush 14. As shown in FIG. 3, the bristle bundle 14c moves circularly with the radius r of circular movement with respect to a rotation center C of the developing brush 14. In addition, two trajectories 14d are shown in FIG. 3, and these are trajectories of circular movement of the bristle bundle 14c of the developing brush 14 at different time points. The developing brush 14 linearly moves by the moving distance d, and d≥r is satisfied in FIG. 3. The moving distance d is a movement amount of the developing brush 14 in the direction Dw. In a case where a time for which the developing brush 14 moves by the moving distance d is known, the moving speed of the developing brush 14 can be identified. That is, the speed of linear reciprocation of the developing brush 14 can be identified.

As d≥r is satisfied under the condition (c), a range where the bristle bundles 14c of the developing brushes 14 overlap each other in a case of linear reciprocation can be made small. Accordingly, generation of a brush mark can be further suppressed, and generation of development unevenness can be further suppressed.

The moving distance d of the developing brush 14 is preferably 20 millimeters (mm) or more, more preferably 60 millimeters (mm) or more, and even more preferably 120 millimeters (mm) or more.

<Washing Method>

Next, the washing method will be described. The washing method is a developing method, and washing is development.

The flexographic printing plate precursor 36 (see FIG. 1) is imagewise exposed in a specific pattern or the like by an exposure device (not shown).

Next, as shown in FIG. 1, the imagewise exposed flexographic printing plate precursor 36 is attached to the support plate 19.

Next, the bristles 14*b* of the developing brush 14 are brought into contact with an image forming surface of the flexographic printing plate precursor 36, that is, the front surface 36*a* of the flexographic printing plate precursor 36.

Next, the washing solution Q is supplied to the developing brush 14 through the pipe 25*b* via the filter 27 by the circulation pump 26. The washing solution Q that is used in at least one time of development and that has passed through the filter 27 is also referred to as a regenerated washing solution.

Next, one crank 18 is rotated by the motor 16, the other crank 18 is also rotated in synchronization therewith, the developing brush 14 circularly moves at a set rotation speed, and the developing brush 14 is further moved by the set moving distance d at a speed set in the direction Dw by the driving unit 21. The development unit 21*a* simultaneously performs circular movement and linear reciprocation of the developing brush 14 while supplying the washing solution Q to the developing brush 14 and develops the imagewise exposed flexographic printing plate precursor 36 by rubbing with the developing brush 14.

A washing step, that is, a developing step is performed such that at least one condition of the conditions (a) or (b) described above is satisfied. Accordingly, generation of a brush mark on the front surface 36*a* of the flexographic printing plate precursor 36 is suppressed, and generation of development unevenness is suppressed.

Further, as described above, development is performed with preferably the condition (c) satisfied and most preferably the conditions (a) to (c) satisfied.

After development, the developing brush 14 is separated from the developed flexographic printing plate precursor 36, and the developed flexographic printing plate precursor is carried out from the developing tank 12. Residues such as latex components and rubber components remaining on the front surface 36*a* are removed as the rinsing unit 20 applies a rinsing liquid to the front surface 36*a* of the flexographic printing plate precursor 36. In addition, the liquid drain nozzle 20*b* removes the rinsing liquid supplied to the flexographic printing plate precursor 36 by the rinsing liquid supply unit 20*a* by jetting a gas or removes the rinsing liquid by sucking a gas. Removing residues, such as latex components and rubber components remaining on the front surface 36*a* of the flexographic printing plate precursor 36, using the rinsing liquid such as a washing solution, by the rinsing unit 20 is referred to as a rinsing step.

In the developing step, in order to promote development, for example, the temperature of the washing solution Q in the tank 22 is adjusted at a constant temperature in a range of 40° C. to 50° C. by the heater 24, and the temperature of the washing solution Q is kept in a managed state.

The washing solution Q used in development returns from the bottom portion 12*b* of the developing tank 12 to the tank 22 via the discharge unit 12*c*. In this case, in a case where the washing solution Q used in development contains solid contents, the solid contents are removed by the filter 23. In addition, the inside of the tank 22 is replenished with the washing solution Q from the replenishing unit 28 according to the amount of the washing solution Q in the tank 22, the concentration of solid contents of the washing solution Q in the tank 22, or the like. The washing solution Q in the tank 22 passes through the pipe 25*b* via the filter 27 by the circulation pump 26 and is supplied to the developing brush 14.

In addition, in a case where the concentration of solid contents of the washing solution Q in the tank 22 exceeds a set concentration or a case where a treatment area of the flexographic printing plate precursor 36 exceeds a set treatment area, the valve 33 is opened, and the washing solution Q in the tank 22 is discharged to the outside of the tank 22.

Second Example of Washout Processor

The washout processor is not limited to the configuration described above.

Figure 4:
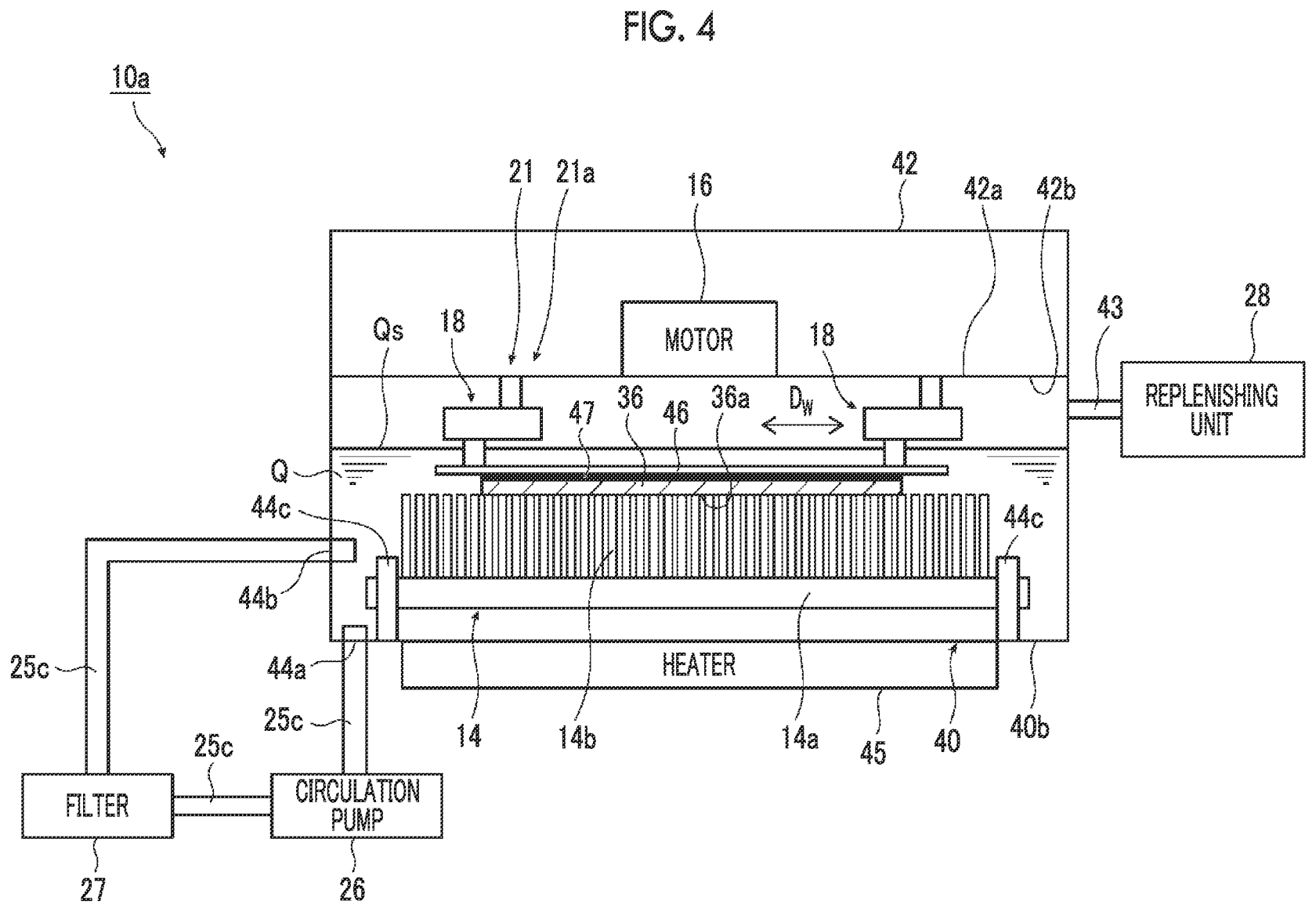
Figure 5:
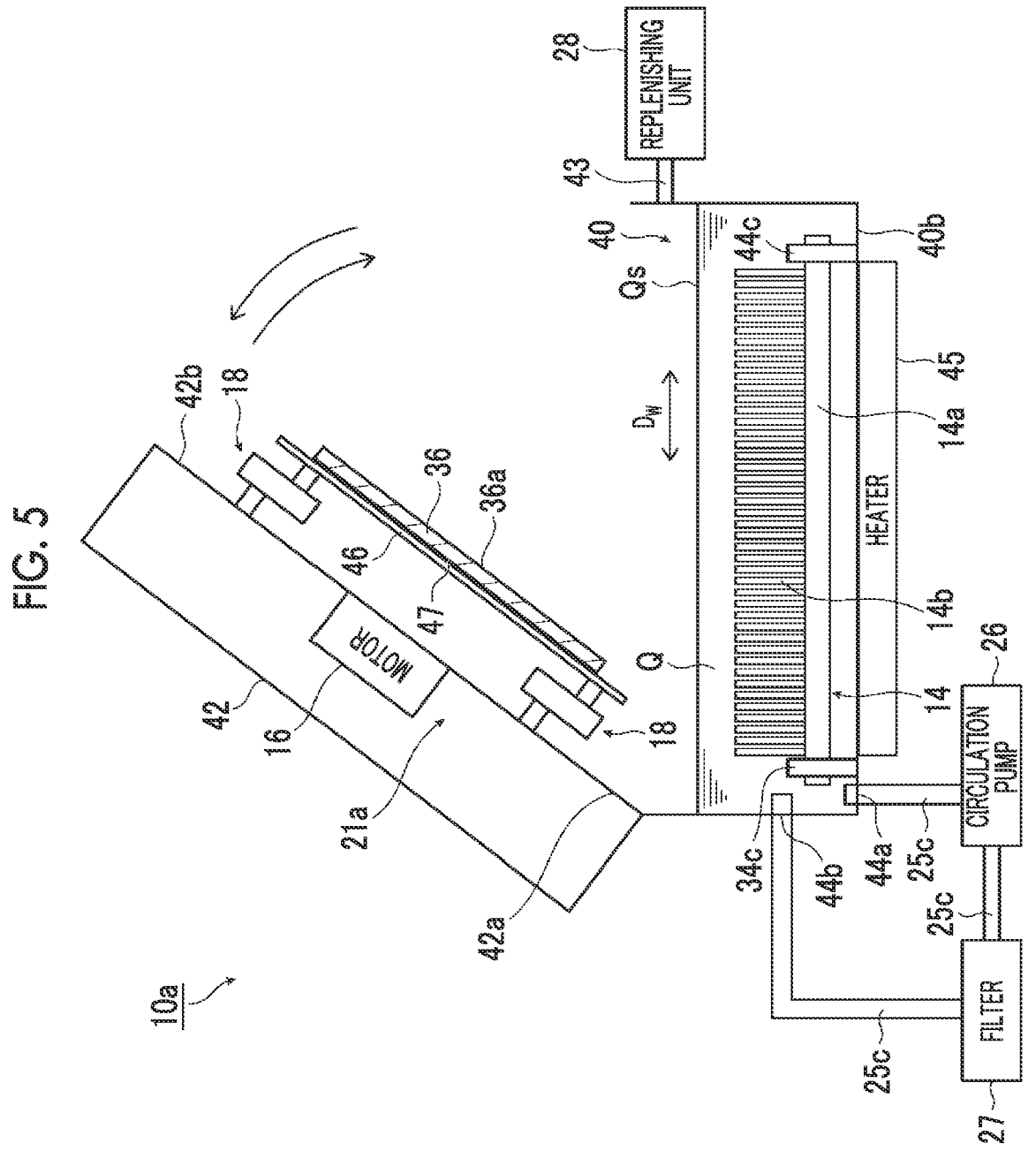
FIG. 5 is a schematic view showing a usage form of the second example of the washout processor according to the embodiment of the present invention.

FIG. 4 is a schematic view showing a second example of a washout processor according to the embodiment of the present invention, and FIG. 5 is a schematic view showing a usage form of the second example of the washout processor according to the embodiment of the present invention. In FIGS. 4 and 5, the same components as those of the washout processor 10 shown in FIG. 1 will be assigned with the same reference numerals, and detailed description thereof will be omitted.

A washout processor 10*a* shown in FIG. 4 has a configuration called a clamshell type. Each configuration unit of the washout processor 10*a* is controlled by a control unit (not shown).

The washout processor 10*a* is different from the washout processor 10 shown in FIG. 1 in that the flexographic printing plate precursor 36 is developed in the washing solution Q in a state of being fixed to the developing brush 14.

The washout processor 10*a* has a developing tank 40 and a lid 42 of the developing tank 40. The lid 42 is openable and closable with respect to the developing tank 40, and for example, the developing tank 40 and the lid 42 are connected to each other, for example, using a hinge (not shown). In a state where the lid 42 is closed, a back surface 42*b* of the lid 42 faces a liquid level Qs of the washing solution Q in the developing tank 40.

The developing brush 14 is disposed in the developing tank 40. The developing brush 14 is obtained, for example, by bundling the bristles 14*b* perpendicular to the quadrangular substrate 14*a* in plan view. The substrate 14*a* is fixed into the developing tank 40 by a fixing unit 44*c*. The shape of the substrate 14*a* is the shape of the developing brush 14. The shape of the substrate 14*a* is not limited to a quadrangle in plan view.

The replenishing unit 28 is provided at a side surface of the developing tank 40. The replenishing unit 28 has a replenishment tank (not shown) in which the washing solution is stored and a replenishment pump (not shown). The replenishing unit 28 is connected to a supply pipe 43 through which the washing solution is sent to the developing tank 40. The inside of the developing tank 40 is replenished with the washing solution from the supply pipe 43.

A pipe 25*c* that connects a drain hole 44*a* in a bottom surface of the developing tank 40 to a water supply hole 44*b* in the side surface of the developing tank 40 is provided. The circulation pump 26 and the filter 27 are provided at the pipe 25*c* from a drain hole 44*a* side. The washing solution Q that is used in at least one time of development and that has passed through the filter 27 is supplied into the developing tank 40 via the water supply hole 44*b* as a regenerated washing solution.

A heater 45 is provided at a back surface 40*b* of the developing tank 40 to face the substrate 14*a* of the developing brush 14. The heater 45 keeps the washing solution Q in the developing tank 40 at a determined temperature. The configuration of the heater 45 is not particularly limited, a known configuration is usable as appropriate, and the heater 24 (see FIG. 1) described above can be used.

Inside the lid 42, the motor 16 is provided at a center position of a bottom plate 42a of the lid 42 in plan view. For example, four cranks 18 are provided at the back surface 42b of the lid 42. Each of the cranks 18 is connected to a flat plate-shaped fixing member 46. On the opposite side of each of the cranks 18, a support plate 47 is connected to the fixing member 46. The imagewise exposed flexographic printing plate precursor 36 is fixed to the support plate 47. The support plate 47 is composed of, for example, a quadrangular adhesive plate in plan view.

In addition, each of the four cranks 18 is connected to the motor 16. A method of connecting the motor 16 and the four cranks 18 to each other is not particularly limited, and connection is made through a known connecting method. The four cranks 18 are simultaneously rotated by the motor 16, and the flat plate-shaped fixing member 46 rotates. Accordingly, the flexographic printing plate precursor 36 moves circularly relative to the developing brush 14.

By changing the rotation speed of the motor 16, the rotation speed of circular movement of the flexographic printing plate precursor 36 can be adjusted. In addition, the radius of the circular movement of the flexographic printing plate precursor 36 is determined by, for example, the size of the crank 18. The radius of the circular movement of the flexographic printing plate precursor 36 is adjusted by the size of the crank 18.

In addition, the fixing member 46 has a drive mechanism for moving in the direction Dw parallel to a front surface of the fixing member 46 (not shown). The direction Dw is a linear reciprocating direction of the flexographic printing plate precursor 36. The flexographic printing plate precursor 36 is moved in the direction Dw by the drive mechanism. That is, the flexographic printing plate precursor 36 is linearly reciprocated. The drive mechanism further moves the flexographic printing plate precursor 36 by a distance set in one direction in the direction Dw in a state of rotationally moving the flexographic printing plate precursor, then reverses and moves the flexographic printing plate precursor by a distance set in the other direction, which is an opposite direction of the one direction, and linearly reciprocates the flexographic printing plate precursor. The drive mechanism reciprocates the flexographic printing plate precursor 36 a set number of times of reciprocation. The set distance described above is also referred to as a stroke. In addition, the drive mechanism can also adjust the speed of linear reciprocation of the flexographic printing plate precursor 36, that is, a moving speed in the direction Dw.

The moving speed in the direction Dw described above, the set distance described above, a total reciprocating distance, the number of times of reciprocation in linear reciprocation are not particularly limited and are determined as appropriate depending on development of the flexographic printing plate precursor 36.

The drive mechanism has, for example, a guide roller (not shown), a guide frame (not shown), and a motor (not shown). The drive mechanism may be configured to have a linear guide and the motor.

For example, the driving unit 21 is composed of the fixing member 46, the motor 16, and the cranks 18. The development unit 21a has the driving unit 21 and the developing brush 14 and develops the exposed flexographic printing plate precursor 36 in the washing solution Q.

The flexographic printing plate precursor 36 is rotated by the driving unit 21 and the drive mechanism, the fixing member 46 can be moved in the direction Dw, and the developing brush 14 can be circularly moved and linearly reciprocated simultaneously relative to the front surface 36a of the flexographic printing plate precursor 36.

The washout processor 10a does not move the developing brush 14 unlike the washout processor 10 (see FIG. 1) described above, moves the flexographic printing plate precursor 36 such that the image forming surface of the flexographic printing plate precursor 36 circularly moves and linearly reciprocates simultaneously relative to the developing brush 14 in the washing solution Q, and rubs the imagewise exposed flexographic printing plate precursor 36 with the developing brush 14, performing development.

In addition, in the washout processor 10a, as shown in FIG. 5, the lid 42 is opened, and the support plate 47 is fixed to the fixing member 46, for example, using a gluing agent. Accordingly, the flexographic printing plate precursor 36 can be fixed to the fixing member 46. In a case of removing the flexographic printing plate precursor 36, the lid 42 is opened, and the support plate 47 is removed from the fixing member 46.

The washout processor 10a may have a rinsing unit (not shown) like the washout processor 10 shown in FIG. 1. Since the washout processor 10a is a clamshell type, in a state where the lid 42 is opened, residues such as latex components and rubber components remaining on the front surface 36a are removed with a rinsing liquid applied to the front surface 36a of the developed flexographic printing plate precursor 36. In addition, the rinsing liquid supplied to the flexographic printing plate precursor 36 is removed by jetting a gas or is removed by sucking a gas.

<Washing Method>

A washing method of the washout processor 10a will be described.

First, the imagewise exposed flexographic printing plate precursor 36 is attached to the support plate 47, and the support plate 47 is attached to the fixing member 46. The inside of the developing tank 40 is filled with the washing solution Q. Then, the lid 42 is closed. The flexographic printing plate precursor 36 is immersed in the washing solution Q. The image forming surface, that is, the front surface 36a of the flexographic printing plate precursor 36 is brought into contact with the bristles 14b of the developing brush 14.

Next, the one crank 18 is rotated by the motor 16, the other crank 18 is also rotated in synchronization with the rotation, the flexographic printing plate precursor 36 is swung, and the flexographic printing plate precursor 36 is moved in the direction Dw by the drive mechanism. Accordingly, the flexographic printing plate precursor 36 is moved such that the image forming surface of the flexographic printing plate precursor 36 is circularly moved and linearly reciprocated simultaneously relative to the developing brush 14 in the washing solution Q, and the flexographic printing plate precursor 36 is developed in a state of being immersed in the washing solution Q.

After development, the lid 42 is opened, and the developed flexographic printing plate precursor 36 is taken out from the washing solution Q. Next, the support plate 47 is removed from the fixing member 46, and the flexographic printing plate precursor 36 is removed from the support plate 47.

In a case of performing the rinsing step, after development, the lid 42 is opened, a rinsing liquid, for example, fresh water is supplied to the front surface 36a of the flexographic printing plate precursor 36, and residues such as latex components and rubber components remaining on the front surface 36a of the flexographic printing plate precursor 36 are removed. Further, the rinsing liquid supplied to the flexographic printing plate precursor 36 by the rinsing liquid supply unit 20*a* is removed by jetting a gas or is removed by sucking a gas. After the rinsing step, the flexographic printing plate precursor 36 is removed from the washout processor 10*a*.

Hereinafter, the flexographic printing plate precursor will be described.

(Flexographic Printing Plate Precursor)

The flexographic printing plate precursor 36 forms a flexographic printing plate used in flexographic printing, and the configuration thereof is not particularly limited. The flexographic printing plate precursor 36 is as thin as several millimeters and has flexibility. Having flexibility means returning from a bent state caused by an acting force to the original state after unloading the force. The size of the flexographic printing plate precursor 36 is, for example, 800 mm×1,200 mm, and 1,050 mm×1,500 mm. Since development is performed by moving the developing brush 14 (see FIG. 1) in the washout processor 10 (see FIG. 1), it is also possible to respond to the large flexographic printing plate precursor 36.

It is preferable that the flexographic printing plate precursor 36 is a flexographic printing plate precursor that can be developed with a water-based washing solution of which a main component is water and a flexographic printing plate precursor that is called a water-developing type flexographic printing plate precursor. In this case, the washing solution is the water-based washing solution.

A known flexographic printing plate precursor that can be developed with the water-based washing solution is usable as the flexographic printing plate precursor 36, and examples of the flexographic printing plate precursor 36 include a flexographic plate material for computer to plate (CTP) having a surface to which a black layer is applied. The black layer configures a black mask.

Hereinafter, the washing solution will be described.

<Washing Solution>

It is preferable that the washing solution is a water-based washing solution and it is more preferable that the washing solution has water as a main component. Having water as a main component means a water content is 90% by mass or more.

The washing solution may be a solution consisting of only water and may be an aqueous solution which contains 50% by mass or more of water and to which a water soluble compound is added. Examples of the water soluble compound include surfactants, acids, and alkaline agents. The washing solution also contains chelating agents. The water-based washing solution described above corresponds to the water-based washing solution.

Examples of the surfactant include anionic surfactants, nonionic surfactants, cationic surfactants, and amphoteric surfactants, and among the surfactants, anionic surfactants are preferable.

In addition, the surfactants may be used alone or may be used in combination of two or more types thereof.

Specific examples of the anionic surfactant include aliphatic carboxylates such as sodium laurate and sodium oleate; higher alcohol sulfate ester salts such as sodium lauryl sulfate, sodium cetyl sulfate, and sodium oleyl sulfate; polyoxyethylene alkyl ether sulfates such as sodium polyoxyethylene lauryl ether sulfate; polyoxyethylene alkyl allyl ether sulfates such as sodium polyoxyethylene octylphenyl ether sulfate and sodium polyoxyethylene nonylphenyl ether sulfate; alkyl sulfonates such as alkyldiphenyl ether disulfonate, sodium dodecyl sulfonate, and sodium dialkyl sulfosuccinate; alkyl allyl sulfonates such as alkyl disulfonate, sodium dodecylbenzene sulfonate, sodium dibutylnaphthalene sulfonate, and sodium triisopropylnaphthalene sulfonate; higher alcohol phosphate ester salts such as lauryl phosphate monoester disodium and sodium lauryl phosphate diester; polyoxyethylene alkyl ether phosphoric acid ester salts such as polyoxyethylene lauryl ether phosphoric acid monoester disodium and polyoxyethylene lauryl ether phosphoric acid diester sodium.

In addition, since contamination of the developing brush of the washout processor by development residues can be suppressed, anionic surfactants having polyoxyethylene units are more preferable, and the polyoxyethylene units have preferably 20 or more repeating units and particularly preferably 30 or more repeating units.

Specific examples of the anionic surfactants having polyoxyethylene units include polyoxyethylene alkyl ether sulfate salts such as sodium polyoxyethylene lauryl ether sulfate; polyoxyethylene alkyl allyl ether sulfate salts such as polyoxyethylene octylphenyl ether sodium sulfate and polyoxyethylene nonylphenyl ether sulfate sodium; polyoxyethylene alkyl ether phosphate salts such as polyoxyethylene lauryl ether monoester disodium phosphate and polyoxyethylene lauryl ether diester sodium phosphate.

These may be used alone or may be used in combination of two or more types. Although a sodium salt is given as a specific example, it is not particularly limited to the sodium salt, and the same effect can be obtained with a calcium salt, an ammonia salt, or the like.

Specific examples of the nonionic surfactant include polyoxyethylene alkyl ethers such as polyoxyethylene oleyl ether and polyoxyethylene lauryl ether, polyoxyethylene polyoxypropylene glycols including polyoxyethylene alkyl phenyl ethers such as polyoxyethylene nonylphenyl ether and polyoxyethylene octylphenyl ether, mono and diesters of polyethylene glycol and fatty acids such as polyethylene glycol monostearate, polyethylene glycol monooleate, and polyethylene glycol dilaurate, fatty acids and sorbitan esters such as sorbitan monolaurate and sorbitan monooleate, esters of sorbitan polyoxyethylene adducts and fatty acids such as polyoxyethylene sorbitan monolaurate, polyoxyethylene sorbitan monostearate, and polyoxyethylene sorbitan trilaurate, esters fatty acids and sorbitol such as sorbitol monopalmitate and sorbitol dilaurate, esters of sorbitol polyoxyethylene adducts and fatty acids such as polyoxyethylene sorbitol monostearate and polyoxyethylene sorbitol diolate, esters of fatty acids and pentaerythritol such as pentaerythritol monostearate, esters of fatty acids and glycerin such as glycerin monolaurate, fatty acid alkanolamides such as lauric acid diethanolamide and lauric acid monoethanolamide, amine oxides such as lauryl dimethylamine oxide, fatty acid alkanolamines such as stearyl diethanolamine, polyoxyethylene alkylamines, triethanolamine fatty acid esters, alkaline salt compounds such as phosphates, carbonates, and silicates. These may be used alone or may be used in combination of two or more types.

In addition, since contamination of the developing brush of the washout processor by development residues can be suppressed, nonionic surfactants having polyoxyethylene units are more preferable, and the polyoxyethylene units have preferably 20 or more repeating units and particularly preferably 30 or more repeating units.

Specific examples of the cationic surfactant include primary, secondary and tertiary amine salts such as monostearylammonium chloride, distearylammonium chloride, and tristearylammonium chloride, quaternary ammonium salts such as stearyltrimethylammonium chloride, distearyldimethylammonium chloride, and stearyldimethylbenzylammonium chloride, alkylpyridinium salts such as N-cetylpyri-dinium chloride and N-stearylpyridinium chloride, N, N-dialkyl morpholinium salts, fatty acid amide salts of polyethylene polyamines, acetic acids of urea compounds of amides of aminoethylethanolamine and stearic acid, and 2-alkyl-1-hydroxyethylimidazolinium chloride. These may be used alone or may be used in combination of two or more types.

Specific examples of the amphoteric surfactant include amino acid types such as sodium lauryl aminopropionate, carboxybetaine types such as lauryldimethylbetaine and lauryldihydroxyethylbetaine, sulfobetaine types such as stearyldimethylsulfoethyleneammonium betaine, imidazolinium betaine types, and lecithin. These may be used alone or may be used in combination of two or more types.

Specific examples of the acid include inorganic acids or organic acids such as hydrochloric acid, sulfuric acid, nitric acid, phosphoric acid, formic acid, acetic acid, oxalic acid, succinic acid, citric acid, malic acid, maleic acid, and paratoluenesulfonic acid.

Specific examples of the alkaline agent include lithium hydroxide, sodium hydroxide, magnesium hydroxide, potassium hydroxide, calcium hydroxide, calcium oxide, sodium carbonate, sodium hydrogencarbonate, and calcium carbonate.

Specific examples of the chelating agent, that is, a metal blocking agent, include citric acid, ethylenediaminetet-raacetic acid (EDTA), ethylenediamine-N, N'-disuccinic acid (EDDS), L-glutamic acid N,N-diacetic acid (GLDA), and alkali metal salt.

Hereinafter, the fatiqued developer will be described in detail.

<Fatiqued Developer>

The fatiqued developer is a washing solution used in development. The fatiqued developer is not particularly limited insofar as the fatiqued developer is a washing solution containing solid substances generated by removing the non-exposed portion of the flexographic printing plate precursor due to development using the washing solution described above, that is, a washing solution containing an uncured resin. However, a fatiqued developer containing a known photosensitive resin composition of the related art for forming a general photosensitive resin layer may be included.

The uncured resin removed through development may be a photosensitive resin contained in the photosensitive resin composition.

In addition, since it is preferable to set a fatiqued developer in a case of developing under a laser ablation masking (LAM) method as a processing target, it is preferable that the uncured resin removed through development is the photosensitive resin contained in the photosensitive resin composition.

In addition, since examples of such a photosensitive resin composition include a composition containing a polymerization initiator, a polymerizable compound, a polymerization inhibitor, and a plasticizer, in addition to the photosensitive resin, the fatiqued developer may contain a polymerization initiator, a polymerizable compound, a polymerization inhibitor, a plasticizer, and the like, in addition to the uncured resin.

<Uncured Resin>

The uncured resin contained in the fatiqued developer is solid substances generated by removing the non-exposed portion of the flexographic printing plate precursor. The solid substances are sensitizer components dispersed in the washing solution described above.

Examples of the uncured resin contained in the fatiqued developer include water-dispersible latex, rubber components, polymer components, and uncrosslinked ethylenically unsaturated compounds (polymers).

Examples of the water-dispersible latex include water-dispersed latex polymers including water-dispersed latex such as polybutadiene latex, natural rubber latex, styrene-butadiene copolymer latex, acrylonitrile-butadiene copolymer latex, polychloroprene latex, polyisoprene latex, polyurethane latex, methyl methacrylate-butadiene copolymer latex, vinyl pyridine copolymer latex, butyl polymer latex, thiocol polymer latex, and acrylate polymer latex and polymers obtained by copolymerizing these polymers with other components such as acrylic acid or methacrylic acid.

Examples of the rubber component include butadiene rubber, isoprene rubber, styrene-butadiene rubber, acrylonitrile rubber, acrylonitrile butadiene rubber, chloroprene rubber, polyurethane rubber, silicon rubber, butyl rubber, ethylene-propylene rubber, and epichlorohydrin rubber.

The polymer component may be hydrophilic or may be hydrophobic, and specific examples thereof include a polyamide resin, an unsaturated polyester resin, an acrylic resin, a polyurethane resin, a polyester resin, and polyvinyl alcohol resin.

The solid substances having a specific gravity lower than the washing solution are, for example, photosensitive resins such as rubber components and latex.

The solid substances having a specific gravity higher than the washing solution are, for example, components of overcoat layers such as carbon.

Examples of the ethylenically unsaturated compound (polymer) include (meth) acrylic modified polymers having an ethylenically unsaturated bond in the molecule.

Examples of the (meth) acrylic modified polymer include (meth) acrylic modified butadiene rubber and (meth) acrylic modified nitrile rubber.

"(Meth) acrylic" is a notation representing acrylic or methacrylic, and "(meth) acrylate" to be described later is a notation representing acrylate or methacrylate.

The uncured resin contained in the fatiqued developer is not particularly limited, but is preferably 70% by mass or less, and more preferably 35% by mass or less.

<Polymerization Initiator>

The polymerization initiator that may be contained in the fatiqued developer is preferably a photopolymerization initiator.

Examples of the photopolymerization initiator described above include alkylphenones, acetophenones, benzoin ethers, benzophenones, thioxanthones, anthraquinones, benzyls, and biacetyls, and among them, alkylphenones are preferable.

Specific examples of the alkylphenones photopolymerization initiators include 2,2-dimethoxy-1,2-diphenylethane-1-one, 1-hydroxy-cyclohexyl-phenyl-ketone, and 2-hydroxy-2-methyl-1-phenyl-propane-1-one.

The concentration of the polymerization initiator that may be contained in the fatiqued developer is not particularly limited, but is preferably 2.0% by mass or less, and more preferably 1.0% by mass or less.

<Polymerizable Compound>

Examples of the polymerizable compound that may be contained in the fatiqued developer include ethylenically unsaturated compounds that correspond to so-called monomer components other than the ethylenically unsaturated compounds (polymers) described above.

The ethylenically unsaturated compound may be a compound having one ethylenically unsaturated bond or may be a compound having two or more ethylenically unsaturated bonds.

Specific examples of the compound having one ethylenically unsaturated bond include (meth) acrylate having a hydroxyl group such as 2-hydroxyethyl (meth) acrylate, 2-hydroxypropyl (meth) acrylate, 2-hydroxybutyl (meth) acrylate, 3-chloro-2-hydroxypropyl (meth) acrylate, and β-hydroxy-β'-(meth) acryloyloxyethyl phthalate; alkyl (meth) acrylates such as methyl (meth) acrylate, ethyl (meth) acrylate, propyl (meth) acrylate, butyl (meth) acrylate, iso-amyl (meth) acrylate, 2-ethylhexyl (meth) acrylate, lauryl (meth) acrylate, and stearyl (meth) acrylate; cycloalkyl (meth) acrylates such as cyclohexyl (meth) acrylate; alkyl halogenated (meth) acrylates such as chloroethyl (meth) acrylate and chloropropyl (meth) acrylate; alkoxyalkyl (meth) acrylates such as methoxyethyl (meth) acrylate, ethoxyethyl (meth) acrylate, and butoxyethyl (meth) acrylate; phenoxyalkyl (meth) acrylates such as phenoxyethyl (meth) acrylate and nonylphenoxyethyl (meth) acrylate; alkoxyalkylene glycol (meth) acrylates such as ethoxydiethylene glycol (meth) acrylate, methoxytriethylene glycol (meth) acrylate, and methoxydipropylene glycol (meth) acrylate; 2,2-dimethylaminoethyl (meth) acrylate, 2,2-diethylaminoethyl (meth) acrylate, 2-hydroxyethyl (meth) acrylate, and 3-chloro-2-hydroxypropyl (meth) acrylate.

Specific examples of the ethylenically unsaturated compound having two or more ethylenically unsaturated bonds include alkyldiol di (meth) acrylates such as 1,9-nonane diol di (meth) acrylate; polyethylene glycol di (meth) acrylates such as diethylene glycol di (meth) acrylate; polypropylene glycol di (meth) acrylates such as dipropylene glycol di (meth) acrylate; polyvalent (meth) acrylates obtained by addition reaction of a compound having an ethylenically unsaturated bond, such as unsaturated carboxylic acid and unsaturated alcohol, and active hydrogen with trimethylolpropane tri (meth) acrylate, pentaerythritol tri (meth) acrylate, pentaerythritol tetra (meth) acrylate, glycerol tri (meth) acrylate, and ethylene glycol diglycidyl ether; polyvalent (meth) acrylates obtained by addition reaction of an unsaturated epoxy compound such as glycidyl (meth) acrylate with a compound having active hydrogen such as carboxylic acid and amine; polyvalent (meth) acrylamides such as methylenebis (meth) acrylamide; polyvalent vinyl compounds such as divinylbenzene.

The concentration of the polymerizable compound that may be contained in the fatiqued developer is not particularly limited, but is preferably 30.0% by mass or less, and more preferably 15.0% by mass or less.

<Polymerization Inhibitor>

Specific examples of the polymerization inhibitor that may be contained in the fatiqued developer include hydroquinone monomethyl ether, p-methoxyphenol, di-t-butyl-p-cresol, pyrogallol, t-butylcatechol, benzoquinone, 4,4'-thiobis (3-methyl-6-t-butylphenol), 2,2'-methylenebis (4-methyl-6-t-butylphenol), and N-nitrosophenylhydroxyamine cerous salt.

The concentration of the polymerization inhibitor that may be contained in the fatiqued developer is not particularly limited, but is preferably 0.3% by mass or less, and more preferably 0.15% by mass or less.

<Plasticizer>

Examples of the plasticizer that may be contained in the fatiqued developer include liquid rubber, oil, polyester, and phosphoric acid-based compounds.

Specific examples of the liquid rubber include liquid polybutadiene, liquid polyisoprene, and those modified with maleic acid or an epoxy group.

Specific examples of the oil include paraffin oil, naphthenic oil, and aroma oil.

Specific examples of the polyester include adipic acid-based polyester.

Specific examples of the phosphoric acid-based compound include phosphoric acid ester.

The concentration of the plasticizer that may be contained in the fatiqued developer is not particularly limited, but is preferably 30% by mass or less, and more preferably 15% by mass or less.

A reused washing solution obtained by removing a washing solution after development, that is, solid contents or the like of a fatiqued developer is referred to as a regenerated washing solution. The regenerated washing solution is used in at least one time of development, and the washing solution Q that has passed through the filter 27 in order to remove solid contents or the like of the fatiqued developer is also referred to as a regenerated washing solution. The regenerated washing solution is the fatiqued developer processed by the filter 27.

The present invention is basically configured as described above. Although the washout processor and the washing method according to the embodiment of the present invention have been described in detail hereinbefore, the present invention is not limited to the embodiment described above, and it is evident that various improvements or changes may be made without departing from the gist of the present invention.

EXAMPLES

Hereinafter, characteristics of the present invention will be described in further detail with reference to examples. The materials, reagents, amounts and ratios of substances, operations, and the like shown in the following examples can be appropriately changed without departing from the spirit of the present invention. Therefore, the scope of the present invention is not limited to the following examples.

In the present example, examples 1 to 10 and comparative examples 1 and 2 were evaluated for a brush mark, printed material concentration uniformity, and a development time.

Devices and chemicals used in examples 1 to 10 and comparative examples 1 and 2 are as follows.

<Imaging Machine>

CDI Spark 4835 Inline (manufactured by Esko-Graphics Co., Ltd.)

<Exposure Machine>

Ultraviolet rays exposure machine Concept 302 ECDLF (product name) (manufactured by Glunz & Jensen)

<Flexographic Printing Plate Precursor>

FLENEX FW-FP (having a plate thickness of 1.70 mm, and manufactured by Fujifilm Global Graphic Systems Co., Ltd.)

<Washing Solution>

Washing solution A: Aqueous solution (concentration is 0.5% by mass) of Finish Power & Pure Powder SP (manufactured by Reckitt Benckiser Japan Ltd.)

Washing solution B: Aqueous solution containing 0.5% by mass of sodium carbonate and 1.0% by mass of Pionin D6131 (manufactured by TAKEMOTO Oil & Fat Co., Ltd.).

<Imagewise Exposure of Flexographic Printing Plate Precursor>

Back exposure was performed by exposing the flexographic printing plate precursor described above from the back surface of the flexographic printing plate precursor with energy of 80 W for 18 seconds using the ultraviolet rays exposure machine described above.

After then, main exposure was performed by capturing a 50% halftone dot image having an image size 22 cm×28 cm through a method of ablating a mask layer using an imaging machine described above and exposing from a front surface (a back surface of the back surface) with 80 W for 600 seconds. The flexographic printing plate precursor on which main exposure was performed was used as the imagewise exposed flexographic printing plate precursor.

Hereinafter, a brush mark, printed material concentration uniformity, and a development time will be described.

[Brush Mark]

The flexographic printing plate precursor after development treatment was dried and post-exposed.

A printed material was acquired through the following method from the flexographic printing plate obtained after being dried and post-exposed as described above. The printed material was visually evaluated for presence or absence of a dot-like brush mark and a streak-like brush mark.

A flexographic printing machine (manufactured by TAIYO KIKAI Ltd., TLF-270) was used as a printing machine. The obtained flexographic printing plate was attached to a plate cylinder (drum) through a cushion tape (manufactured by Lohmann), and was provided in the printing machine. After then, a kiss-touch (printing pressure at which the entire surface of an image started to be inked) was set to 0 (reference printing pressure), and from there, printing was performed on a printing medium at a printing speed of 150 m/min under the condition of pushing in 80 μm, obtaining a printed material. The printing medium used in evaluation was pushed 5,000 times under the conditions described above and then was sampled. As the printing medium, Aurora Coat (product name) 84.9 g/m² (manufactured by Nippon Paper Industries Co., Ltd.) was used. In addition, as an ink, UV flexo ink UV500 (product name, manufactured by T&K TOKA Co., Ltd.) cyan was used.

In addition, as a printed image of the printed material, a 50% halftone dot image having a size 22 cm×28 cm was used. That is, a 50% halftone dot image having a captured image size described above of 22 cm×28 cm was used as the printed image.

[Printed Material Concentration Uniformity]

The flexographic printing plate precursor after development treatment was dried and post-exposed.

The flexographic printing plate obtained after being dried and post-exposed as described above was evaluated for printed material concentration uniformity through the following method.

A flexographic printing machine (manufactured by TAIYO KIKAI Ltd., TLF-270) was used as a printing machine. The obtained flexographic printing plate was attached to a plate cylinder (drum) through a cushion tape (manufactured by Lohmann), and was provided in the printing machine. After then, a kiss-touch (printing pressure at which the entire surface of an image started to be inked) was set to 0 (reference printing pressure), and from there, printing was performed at a printing speed of 150 m/min under the condition of pushing in 80 μm. The printing medium used in evaluation was pushed 5,000 times under the conditions described above and then was sampled. As the printing medium, Aurora Coat (product name) 84.9 g/m² (manufactured by Nippon Paper Industries Co., Ltd.) was used. In addition, as an ink, UV flexo ink UV500 (product name, manufactured by T&K TOKA Co., Ltd.) cyan was used.

In addition, as a printed image, a 50% halftone dot image having a size 22 cm×28 cm was used.

Then, the concentration was measured 30 times by changing the place, that is, the concentration was measured at 30 locations using a spectrocolorimeter eXact (manufactured by X-rite, Inc.) within a 50% halftone dot portion (size 22 cm×28 cm) in the printing medium, and the uniformity of the concentration was evaluated based on the following evaluation standards. The evaluation results are shown in table 2.

As for evaluation, practically, C to A are preferable, B or A is more preferable, and A is even more preferable.

<Evaluation Standard>

A: The coefficient of variation was less than 2%

B: The coefficient of variation was 2% or more and less than 3%

C: The coefficient of variation was 3% or more and less than 4%

D: The coefficient of variation was 4% or more and less than 5%

E: The coefficient of variation was 5% or more

[Development Time]

Back exposure was performed by exposing the flexographic printing plate precursor described above from the back surface of the flexographic printing plate precursor with energy of 80 W for 18 seconds using the ultraviolet rays exposure machine described above. After then, development was performed for each minute from a development time of 1 minute to 20 minutes using a washing processor and the developing brush for each of examples 1 to 10 and comparative examples 1 and 2, and a time required for a floor thickness to become 1,100 μm was used as the development time.

The floor thickness was measured using Dial Thickness Gauge/7321 manufactured by Mitutoyo Corporation.

Hereinafter, examples 1 to 10 and comparative examples 1 and 2 will be described.

Example 1

In example 1, development was performed using the washout processor 10 having the configuration shown in FIG. 1 while the washing solution is supplied to the imagewise exposed flexographic printing plate precursor. In the washout processor 10 shown in FIG. 1, a supply method of a washing solution was a supply type. In example 1, the washing solution A was used as the washing solution.

In the developing brush used in development, the substrate was formed of vinyl chloride, and the bristles made of nylon 6,12 were used. The length of the bristle bundle was 10 mm. In the developing brush, disposition of the bristle bundles 14c shown in FIG. 2 was adopted, the diameter of the bristle bundle 14c was 3.5 mm, a distance between centers of the bristle bundles 14c adjacent to each other in the Y-direction was 12 mm, and a distance between centers in the X-direction was 7 mm.

In the developing brush, the rotation speed was 60 revolutions per minute (rpm), that is, 1 revolution per second (rps), the radius of circular movement was 32 mm, the moving distance was 40 mm, the stop time of linear reciprocation was 0.2 seconds, the speed of linear reciprocation was 18 mm/sec, and the number of times of linear reciprocation per unit time in linear reciprocation of the developing brush was 0.23 times per second. The moving distance was a one-way distance of one time of reciprocation of the developing brush.

The development time was determined by acquiring a development time for which the floor thickness became 1,100 μm under a back exposure condition described above beforehand.

After being dried in a drying shelf at a temperature of 60° C. for 10 minutes, the developed plate was post-exposed by being exposed with energy of 80 W for 180 seconds. Detackification was performed using an ultraviolet (UV)-C fluorescent lamp as necessary to create a flexographic printing plate.

Example 2

Example 2 was different from example 1 in that the substrate of the developing brush was configured using a polyacetal resin, specifically, Delrin (registered trademark), but other points were the same as in example 1.

Example 3

Example 3 was different from example 1 in that the substrate of the developing brush was configured using polytetrafluoroethylene (PTFE), but other points were the same as in example 1.

Example 4

Example 4 was different from example 1 in that development was performed using the washout processor 10a shown in FIG. 4, but other points were the same as in example 1. In example 4, the flexographic printing plate precursor was developed in a state of being immersed in the washing solution. In the washout processor 10a shown in FIG. 4, the supply method of the washing solution was an immersion type.

Example 5

Example 5 was different from example 1 in that the bristles of the developing brush were made of nylon 6,6, but other points were the same as in example 1.

Example 6

Example 6 was different from example 1 in that the stop time of linear reciprocation was 0.5 seconds, but other points were the same as in example 1.

Example 7

Example 7 was different from example 1 in that the stop time of linear reciprocation was 1 second, but other points were the same as in example 1.

Example 8

Example 8 was different from example 1 in that the stop time of linear reciprocation was 0.5 seconds and the speed of linear reciprocation was 7 mm/sec, but other points were the same as in example 1. In example 8, the number of times of linear reciprocation per unit time in linear reciprocation of the developing brush was 0.09 times per second.

Example 9

Example 9 was different from example 1 in that the stop time of linear reciprocation was 0.5 seconds and the speed of linear reciprocation was 120 mm/sec, but other points were the same as in example 1. In example 9, the number of times of linear reciprocation per unit time in linear reciprocation of the developing brush was 1.50 times per second.

Example 10

Example 10 was different from example 1 in that the stop time of linear reciprocation was 0.5 seconds and the speed of linear reciprocation was 7 mm/sec and in that the washing solution B was used as the washing solution, but other points were the same as in example 1. In example 10, the number of times of linear reciprocation per unit time in linear reciprocation of the developing brush was 0.09 times per second.

Comparative Example 1

Comparative example 1 was different from example 1 in that the stop time of linear reciprocation was 1 second and the speed of linear reciprocation was 80 mm/sec, but other points were the same as in example 1. In comparative example 1, the number of times of linear reciprocation per unit time in linear reciprocation of the developing brush was 1.00 time per second.

Comparative Example 2

Comparative example 2 was different from example 1 in that the stop time of linear reciprocation was 1.5 seconds and the speed of linear reciprocation was 120 mm/sec, but other points were the same as in example 1. In comparative example 2, the number of times of linear reciprocation per unit time in linear reciprocation of the developing brush was 1.50 times per second.

TABLE 1

| | | | | | | Operation parameters of developing brush | | | | | |
| | Supply method of washing solution | Type of washing solution | Material for bristles | Material for substrate | Rotation speed (rpm) | Rotation speed (rpm) | Radius of circular movement (mm) | Moving distance (mm) | Stop time of linear reciprocation (second) | Speed of linear reciprocation (mm/sec) | Number of times of linear reciprocation (mm/sec) |
|---|---|---|---|---|---|---|---|---|---|---|---|
| Example 1 | Supply type | Washing solution A | Nylon 6, 12 | Vinyl chloride | 60 | 1 | 32 | 40 | 0.2 | 18 | 0.23 |
| Example 2 | Supply type | Washing solution A | Nylon 6, 12 | Polyacetal resin | 60 | 1 | 32 | 40 | 0.2 | 18 | 0.23 |
| Example 3 | Supply type | Washing solution A | Nylon 6, 12 | PTFE | 60 | 1 | 32 | 40 | 0.2 | 18 | 0.23 |

TABLE 1-continued

| | | | | | | Operation parameters of developing brush | | | | |
| | Supply method of washing solution | Type of washing solution | Material for bristles | Material for substrate | Rotation speed (rpm) | Rotation speed (rpm) | Radius of circular movement (mm) | Moving distance (mm) | Stop time of linear reciprocation (second) | Speed of linear reciprocation (mm/sec) | Number of times of linear reciprocation (mm/sec) |
|---|---|---|---|---|---|---|---|---|---|---|---|
| Example 4 | Immersion type | Washing solution A | Nylon 6, 12 | Vinyl chloride | 60 | 1 | 32 | 40 | 0.2 | 18 | 0.23 |
| Example 5 | Supply type | Washing solution A | Nylon 6, 6 | Vinyl chloride | 60 | 1 | 32 | 40 | 0.2 | 18 | 0.23 |
| Example 6 | Supply type | Washing solution A | Nylon 6, 12 | Vinyl chloride | 60 | 1 | 32 | 40 | 0.5 | 18 | 0.23 |
| Example 7 | Supply type | Washing solution A | Nylon 6, 12 | Vinyl chloride | 60 | 1 | 32 | 40 | 1 | 18 | 0.23 |
| Example 8 | Supply type | Washing solution A | Nylon 6, 12 | Vinyl chloride | 60 | 1 | 32 | 40 | 0.5 | 7 | 0.09 |
| Example 9 | Supply type | Washing solution A | Nylon 6, 12 | Vinyl chloride | 60 | 1 | 32 | 40 | 0.5 | 120 | 1.50 |
| Example 10 | Supply type | Washing solution B | Nylon 6, 12 | Vinyl chloride | 60 | 1 | 32 | 40 | 0.5 | 7 | 0.09 |
| Comparative Example 1 | Supply type | Washing solution A | Nylon 6, 12 | Vinyl chloride | 60 | 1 | 32 | 40 | 1 | 80 | 1.00 |
| Comparative Exemple 2 | Supply type | Washing solution A | Nylon 6, 12 | Vinyl chloride | 60 | 1 | 32 | 40 | 1.5 | 120 | 1.50 |

25

TABLE 2

| | Evaluation | | | |
| | Brush mark | | Printed material | |
| | Dot-like brush mark | Streak-like brush mark | concentration uniformity | Development time (minute) |
|---|---|---|---|---|
| Example 1 | Not generated | Not generated | B | 10 |
| Example 2 | Not generated | Not generated | B | 10 |
| Example 3 | Not generated | Not generated | C | 10 |
| Example 4 | Not generated | Not generated | C | 8 |
| Example 5 | Not generated | Not generated | A | 15 |
| Example 6 | Not generated | Not generated | B | 10 |
| Example 7 | Generated | Not generated | C | 10 |
| Example 8 | Not generated | Not generated | A | 10 |
| Example 9 | Not generated | Generated | C | 10 |
| Example 10 | Not generated | Not generated | A | 10 |
| Comparative Example 1 | Generated | Generated | D | 8 |
| Comparative Example 2 | Generated | Generated | E | 10 |

As shown in table 2, examples 1 to 10 were excellent in terms of a brush mark and printed material concentration uniformity compared to comparative examples 1 and 2.

In comparative examples 1 and 2, the stop time of linear reciprocation was longer than the rotation speed of circular movement, a brush mark was generated, and printed material concentration uniformity was also poor. In comparative example 2, the stop time of linear reciprocation was longer and printed material concentration uniformity was even poorer than in comparative example 1.

In examples 1, 2, and 4 to 9 of examples 1 to 10, the substrate of the developing brush was formed of vinyl chloride or a polyacetal resin, and printed material concentration uniformity was excellent.

In examples 1 to 4 and 6 to 9, nylon 6,12 was used for the bristles of the developing brush, and the development time was short.

In examples 1 to 6 and 8, the conditions (a), (b), and (c) were satisfied, a brush mark and printed material concentration uniformity were excellent compared to example 7 in which the conditions (b) and (c) were satisfied and example 9 in which the conditions (a) and (b) were satisfied.

In example 10, the developing brush was unlikely to be contaminated by development residues compared to examples 1 to 9 and comparative examples 1 to 2.

EXPLANATION OF REFERENCES 10, 10a: washout processor
12: developing tank
12a: opening
12b: bottom portion
12c: discharge unit
12d: opening portion
14: developing brush
14a: substrate
14b: bristle
14c: bristle bundle 14$d$: trajectory
15: support member
15$a$: surface
15$b$: surface
16: motor
18: crank
19: support plate
19$a$: front surface
20: rinsing unit
20$a$: rinsing liquid supply unit
20$b$: liquid drain nozzle
21: driving unit
21$a$: development unit
22: tank
23: filter
24: heater
25$a$: pipe
25$b$: pipe
25$c$: pipe
26: circulation pump
27: filter
28: replenishing unit
29: replenishment tank
30: replenishment pump
31: pipe
32: discharge pipe
33: valve
36: flexographic printing plate precursor
36$a$: front surface
40: developing tank
40$b$: back surface
42: lid
42$a$: bottom plate
42$b$: back surface
43: supply pipe
44$a$: drain hole
44$b$: water supply hole
44$c$: fixing unit
45: heater
46: fixing member
47: support plate
C: rotation center
$D_L$: traveling direction
$D_i$: carry-in direction
Dw: direction
Q: washing solution Qs: liquid level
d: moving distance
r: radius

What is claimed is:

1. A washout processor that develops an imagewise exposed flexographic printing plate precursor using a washing solution with a developing brush, the washout processor comprising:

a development unit that performs development using the washing solution by simultaneously performing circular movement and linear reciprocation of the developing brush on the imagewise exposed flexographic printing plate precursor, wherein the circular movement and the linear reciprocation of the developing brush by the development unit satisfy, of the following conditions (a) to (c), at least conditions (a) and (b) or conditions (b) and (c), condition (a) in a case where a stop time in a case of switching between directions of the linear reciprocation of the developing brush is t seconds and a rotation speed of the circular movement of the developing brush is R times per second, t<R, condition (b) in a case where the number of times of linear reciprocation per unit time in the linear reciprocation of the developing brush is f times per second and the rotation speed of the circular movement of the developing brush is R times per second, f<R, condition (c) in a case where a moving distance in the linear reciprocation of the developing brush is d millimeters and a radius of the circular movement of the developing brush is r millimeters, d≥r.

2. The washout processor according to claim 1, wherein development is performed while the washing solution is supplied from above the developing brush.

3. The washout processor according to claim 1, wherein the developing brush has a substrate and a bristle, and a material for the substrate is a thermoplastic resin, and the thermoplastic resin has a tensile modulus of 25,000 kg/cm² or more and an elongation rate of 10% or more measured according to ASTM International D638.

4. The washout processor according to claim 3, wherein the thermoplastic resin is vinyl chloride or a polyacetal resin.

5. The washout processor according to claim 3, wherein a material for the bristle of the developing brush is nylon 6,12.

* * * * *